(12) United States Patent
Voutsas et al.

(10) Patent No.: US 6,903,370 B2
(45) Date of Patent: Jun. 7, 2005

(54) VARIABLE QUALITY SEMICONDUCTOR FILM SUBSTRATE

(75) Inventors: Apostolos Voutsas, Vancouver, WA (US); Yasuhiro Mitiani, Vancouver, WA (US); Mark A. Crowder, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 21 days.

(21) Appl. No.: 10/705,279

(22) Filed: Nov. 10, 2003

(65) Prior Publication Data

US 2004/0101998 A1 May 27, 2004

Related U.S. Application Data

(62) Division of application No. 10/096,293, filed on Mar. 11, 2002, now Pat. No. 6,660,576.

(51) Int. Cl.[7] .............................................. H01L 31/20
(52) U.S. Cl. .......................... 257/59; 257/190; 438/30; 349/138; 349/158
(58) Field of Search ..................... 257/59, 190; 438/30; 349/138, 158

(56) References Cited

U.S. PATENT DOCUMENTS 5,285,086 A * 2/1994 Fitzgerald, Jr. .............. 257/85
2001/0006409 A1 * 7/2001 Lee ............................. 349/156

* cited by examiner

Primary Examiner—David Nelms
Assistant Examiner—Long Tran
(74) Attorney, Agent, or Firm—David C. Ripma; Matthew D. Rabdau; Joseph P. Curtin (57) ABSTRACT

A substrate and a method for fabricating variable quality substrate materials are provided. The method comprises: selecting a first mask having a first mask pattern; projecting a laser beam through the first mask to anneal a first area of semiconductor substrate; creating a first condition in the first area of the semiconductor film; selecting a second mask having a second mask pattern; projecting the laser beam through the second mask to anneal a second area of the semiconductor film; and, creating a second condition in the second area of the semiconductor film, different than the first condition. More specifically, when the substrate material is silicon, the first and second conditions concern the creation of crystalline material with a quantitative measure of lattice mismatch between adjacent crystal domains. For example, the lattice mismatch between adjacent crystal domains can be measured as a number of high-angle grain boundaries per area.

12 Claims, 5 Drawing Sheets

VARIABLE QUALITY SEMICONDUCTOR FILM SUBSTRATE

CROSS-REFERENCE TO RELATED APPLICATIONS

This application is a divisional of application Ser. No. 10/096,293, filed Mar. 11, 2002, now U.S. Pat. No. 6,660,576, entitled "Substrate and Method for Producing Variable Quality Substrate Material," invented by Apostolos Voutsas et al.

BACKGROUND OF THE INVENTION

1. Field of the Invention

This invention generally relates to liquid crystal display (LCD) semiconductor fabrication and, more particularly, to a system and method for fabricating a substrate with a plurality of areas with different qualities, using a laser annealing process, with a corresponding plurality of masks.

2. Description of the Related Art

Polycrystalline silicon (poly-Si) material is used as the active layer of poly-Si thin film transistors (TFTs), for the fabrication of active-matrix (AM) backplanes. Such backplanes can be used to fabricate AM liquid-crystal displays and can be also combined with other display technologies, for example organic light-emitting diodes (OLEDs).

Poly-Si material is typically formed by the crystallization of initially deposited amorphous Si (a-Si) films. This process can be accomplished via solid-phase-crystallization (SPC), i.e., by annealing the a-Si films in a furnace at appropriate temperature, for a sufficiently long time. Alternatively, laser annealing can also be used to achieve the phase transformation.

Conventionally, all crystallization techniques are applied to a given substrate in such a manner as to yield poly-Si film of a uniform quality throughout the substrate area. In other words, there is no spatial quality differentiation over the area of the substrate. The most important reason for this end result is the inability of the current methods to achieve such quality differentiation. For example, when a-Si film is annealed in a furnace or by rapid-thermal-annealing, all of the layer will be exposed to the same temperature, resulting in the same quality of poly-Si material. In the case of conventional laser annealing, some differentiation is possible, but the price, in terms of loss of throughput, is very high for the modest performance gains. Hence, even for conventional laser annealing, such quality differentiation is not practically feasible.

Recently, a new laser annealing technique has been developed that allows for significant flexibility in the manner that the technique is applied and the resulting film microstructure. This technique relies on lateral growth of Si grains using very narrow laser beams, which are generated by passing a laser beam through a beam-shaping mask and projecting the image of the mask to the film that is being annealed. The method is dubbed Laser-Induced Lateral Growth (LILaC).

Figure 1:
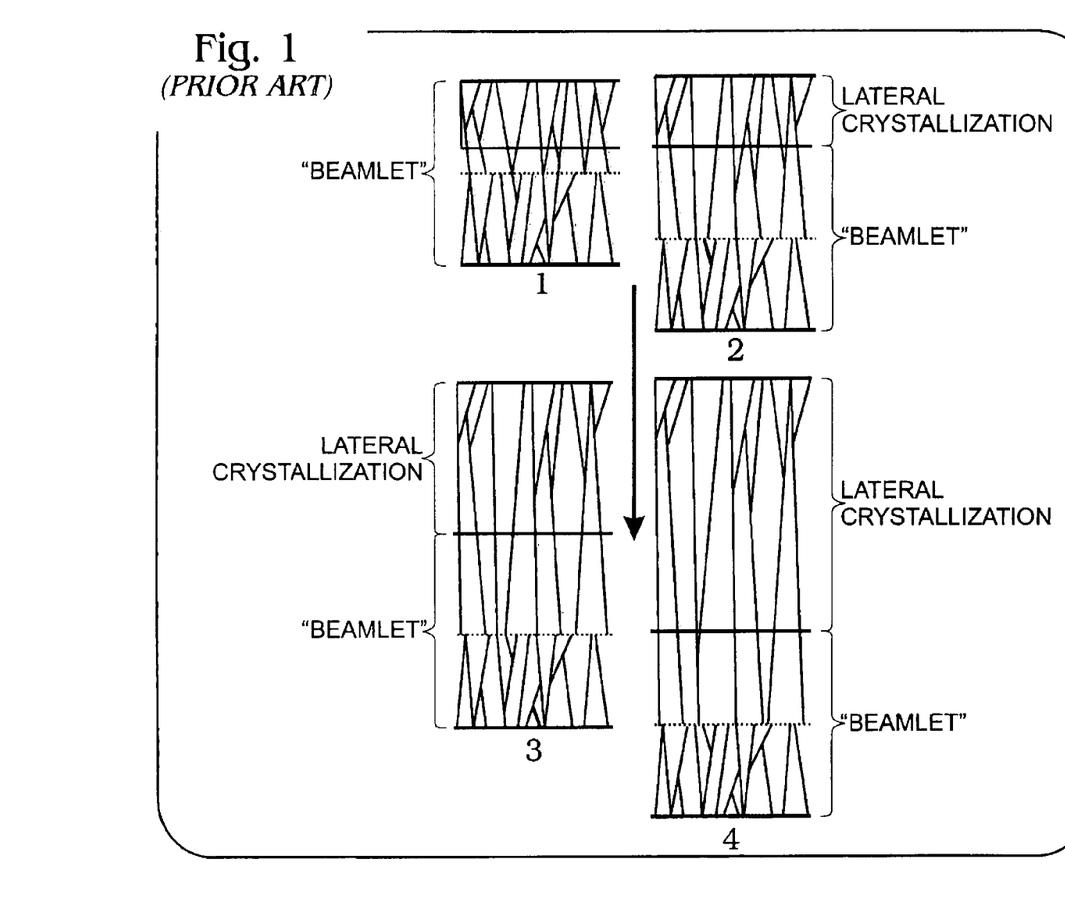
FIG. 1 illustrates steps in an LC-ELA annealing process (prior art).

FIG. 1 illustrates steps in an LC-ELA annealing process (prior art). As seen in Step 1, initially amorphous silicon film is irradiated by a laser beam that is shaped by an appropriate mask to an array of narrow "beamlets". The shape of the beamlets can vary. In Steps 1–4, each beamlet is shaped as a straight slit of narrow width, approximately 3–5 microns ($\mu$m). This slit is represented in the figure as the two heavy lines. The width of the slit is the distance between these two lines. This width can vary, but ultimately it is dependent upon the attainable lateral growth length (LGL), which is defined as the distance crystals can grow laterally (inwardly) from the edges of the irradiated area. Typically, the beamlet width is designed to be slightly less than twice the corresponding LGL.

The sequence of steps in FIG. 1 illustrates the growth of long polysilicon grains by LC-ELA process. A step-and-repeat approach is used. The laser beamlet width (indicated by the 2 parallel, heavy black lines) irradiates the film and, then steps a distance (d), smaller than half of the lateral growth length (L), i.e. d<L/2. Using this step-and-repeat process, it is possible to continually grow crystal grains from the point of the initial irradiation, to the point where the irradiation steps cease. L is dependent upon a combination of film thickness and substrate temperature. For example, a typical value of L, for a 50 nanometer (nm)-thick film at room temperature, is approximately 1.2 microns ($\mu$m). The value of L is due to this slow beamlet advancement. At each step, grains are allowed to grow laterally from the crystal seeds of the polycrystalline silicon (poly-Si) material formed in the previous step.

Figure 2:
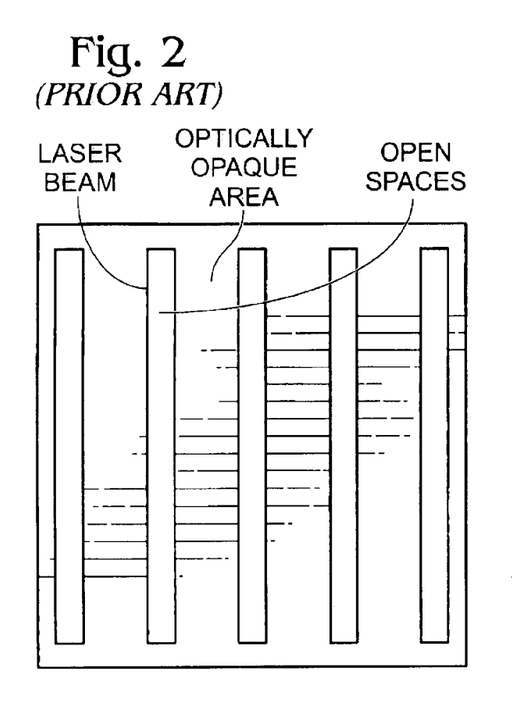
FIG. 2 is a plan view of a conventional optical system mask (prior art).

FIG. 2 is a plan view of a conventional optical system mask (prior art). The above-described process is equivalent to laterally "pulling" the crystals, as in zone-melting-crystallization (ZMR) method or other similar processes. As a result, the crystal tends to attain very high quality along the "pulling" direction, in other words, the direction of the advancing beamlets (shown by the arrow in FIG. 1). This process occurs in a parallel fashion (from each slit on the mask) allowing for rapid crystallization of the area covered by the projection of the mask on the substrate. Once this area is crystallized, the substrate moves to a new (unannealed) location and the process is repeated.

Figure 3:
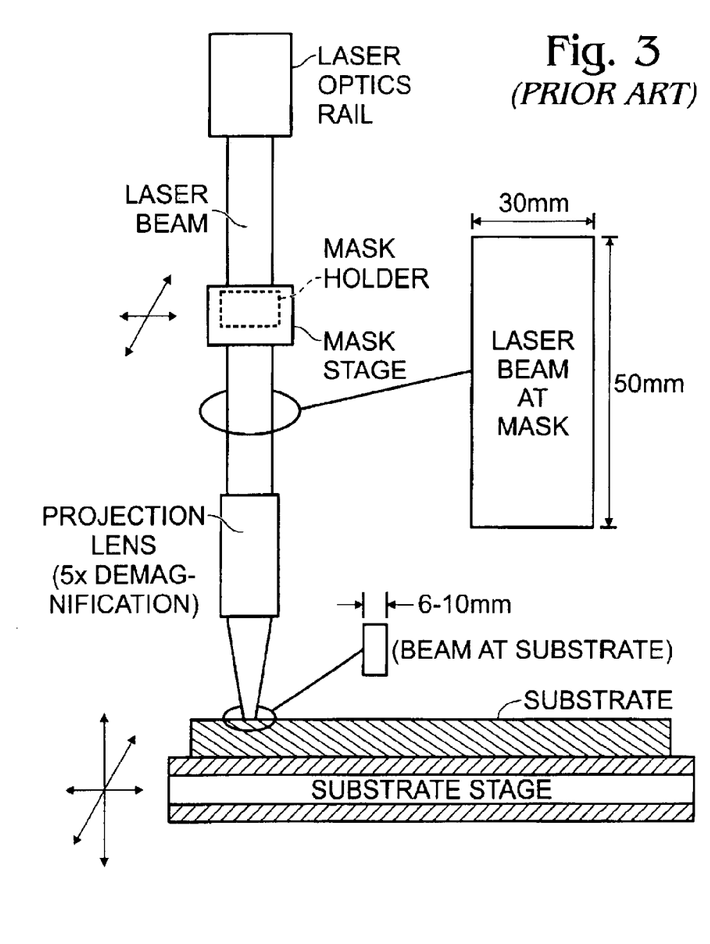
FIG. 3 is a pictorial representation of a system using the above-mentioned optical projection and the step-and repeat-process (prior art).

FIG. 3 is a pictorial representation of a system using the above-mentioned optical projection and the step-and repeat-process (prior art). Due to the step-and-repeat aspect of the laser projection, as opposed to furnace processes that treat a substrate uniformly, the LILaC process has the potential of permitting intentional spatial variations in the quality of the poly-Si material that is formed. Such intentional variations can be beneficial for applications where multiple components are integrated on an LCD display, where each component has different specifications and material performance requirements.

It would be advantageous if different areas of a substrate could be formed to different quality standards, to suit the function of the substrate area.

It would be advantageous if an entire substrate did not have to be annealed to meet the more stringent quality requirements of one particular area of the substrate.

It would be advantageous if a step-and-repeat laser annealing process could be used to anneal different areas of a substrate to different quality levels, according to need.

SUMMARY OF THE INVENTION

The present invention describes a process that yields poly-Si material on a given substrate having intentional variability in its crystalline quality. Furthermore, the process can precisely and reproducibly place p-Si material of a given quality to an exact location within the processed substrate.

Using variable poly-Si material quality on the same substrate enables monolithic integration of components, which have different material requirements, with simultaneous optimization of process throughput. Process throughput is inversely proportional to p-Si material quality. That is, low throughput corresponds to high quality. However, the poly-Si material quality and the area it occupies on a substrate are also inversely proportionally related (high quality to a small area). Hence, an opportunity exists to improve throughput and allow for integration of advanced components by utilizing LILaC technology in the manner that is described by the present invention.

Accordingly, a method is provided for fabricating variable quality substrate materials. The method comprises: selecting a first mask having a first mask pattern; projecting a laser beam through the first mask to anneal a first area of semiconductor substrate; creating a first condition in the first area of the semiconductor film; selecting a second mask having a second mask pattern; projecting the laser beam through the second mask to anneal a second area of the semiconductor film; and, creating a second condition in the second area of the semiconductor film, different than the first condition.

More specifically, when the substrate material is silicon, the first and second conditions concern the creation of crystalline material with a quantitative measure of lattice mismatch between adjacent crystal domains within their respective crystallized areas. For example, the lattice mismatch between crystal domains can be measured as a number of high-angle grain boundaries per area, where high-angle grain boundaries are boundaries separating adjacent crystal domains with a crystal lattice mismatch angle in the range between 15 and 90 degrees. To continue the example, forming a first number of high-angle grain boundaries per area in the first area may include forming adjacent high-angle grain boundaries separated by a first distance, while forming a second number of high-angle grain boundaries per area in the second area may include forming adjacent high-angle grain boundaries separated by a second distance, greater than the first distance.

The measurement of a distance between adjacent high-angle boundaries can be useful as a measurement of quality. For example, the second (greater) distance mentioned above may permit the complete formation of a transistor channel region in the second area between adjacent high-angle boundaries, that cannot be formed in the first area.

In some aspects, the method further comprises: selecting a plurality of masks; projecting the laser beam through each mask to anneal a corresponding area of semiconductor substrate; and, creating a particular condition in each area of the semiconductor film.

Additional details of the above-mentioned method, and a variably quality substrate are described below.

DETAILED DESCRIPTION OF THE PREFERRED EMBODIMENTS

Figure 4:
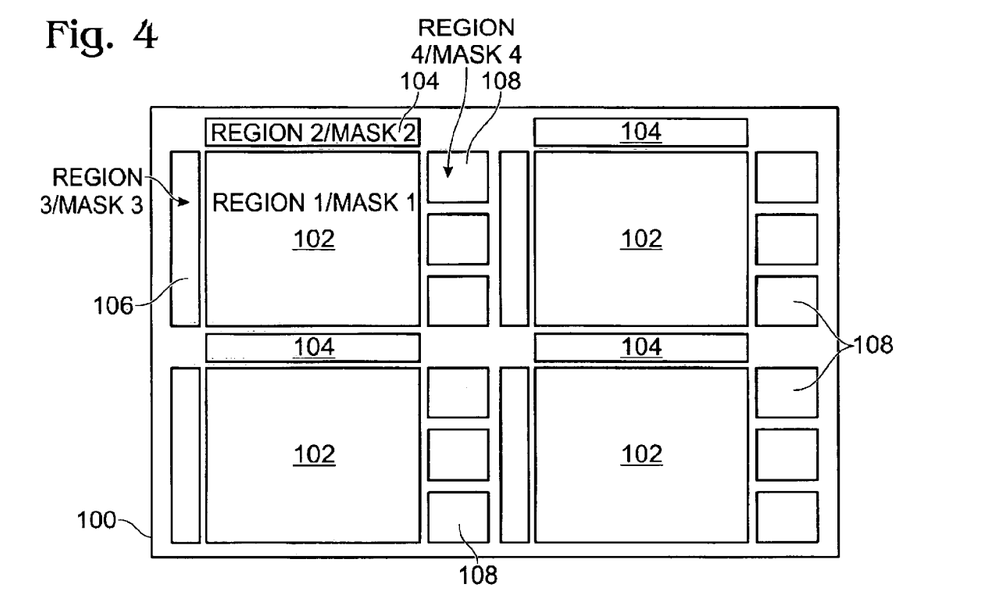
FIG. 4 is a plan view of the present invention variable quality semiconductor film substrate.

FIG. 4 is a plan view of the present invention variable quality semiconductor film substrate. The substrate 100 comprises a first area 102 with semiconductor film including crystalline material having a first lattice mismatch between adjacent crystal domains, and a second area 104 with semiconductor film including crystalline material having a second lattice mismatch between adjacent crystal domains, less than the first lattice mismatch. Of particular interest are silicon substrates used in the formation of TFTs of a substrate that makes up the panel of an LCD. Shown are a plurality of areas with semiconductor film including crystalline material, each area having a particular degree of lattice mismatch between adjacent crystal domains.

More specifically, a first area (region 1) 102, a second area (region 2) 104, a third area (region 3) 106, and a fourth area (region 4) 108 are shown. The first area 102 is associated with a first mask, or a first mask pattern. Likewise, the second area 104 is formed using a second mask, the third area 106 is formed using a third mask, and the fourth area 108 is formed with a fourth mask. Although four different areas are shown, the present invention substrate 100 is not limited to any particular number of areas, or the use of any particular number of masks. Note that the areas are repeated in four quadrants of the substrate. Alternately stated, non-adjacent first areas 102 are formed on the substrate. Likewise, nonadjacent second, third, and fourth 104/106/108 areas are formed. Again, the present invention substrate 100 is not limited to any particular pattern of different areas, pattern of nonadjacent areas, or number of nonadjacent areas.

As a measure of quality, the first area 102 includes a first number of high-angle grain boundaries per area. This measurement includes the consideration of the number of crystal grains in an area, the number of high-angle boundaries between grains, and the size of the area. The second area 104 includes a second number of high-angle grain boundaries per area, smaller than the first number per area. Therefore, the polycrystalline material in the second area 104 is higher than in the first area 102. Transistors formed in the second area 104 should have a higher electron mobility. Alternately stated, the first area 102 includes a first number of high-angle grain boundaries per areas with a crystal lattice mismatch angle in the range between 15 and 90 degrees, and the second area 104 includes a second number of high-angle grain boundaries per areas with a crystal lattice mismatch angle in the range between 15 and 90 degrees, less than the first number per area.

Figure 5:
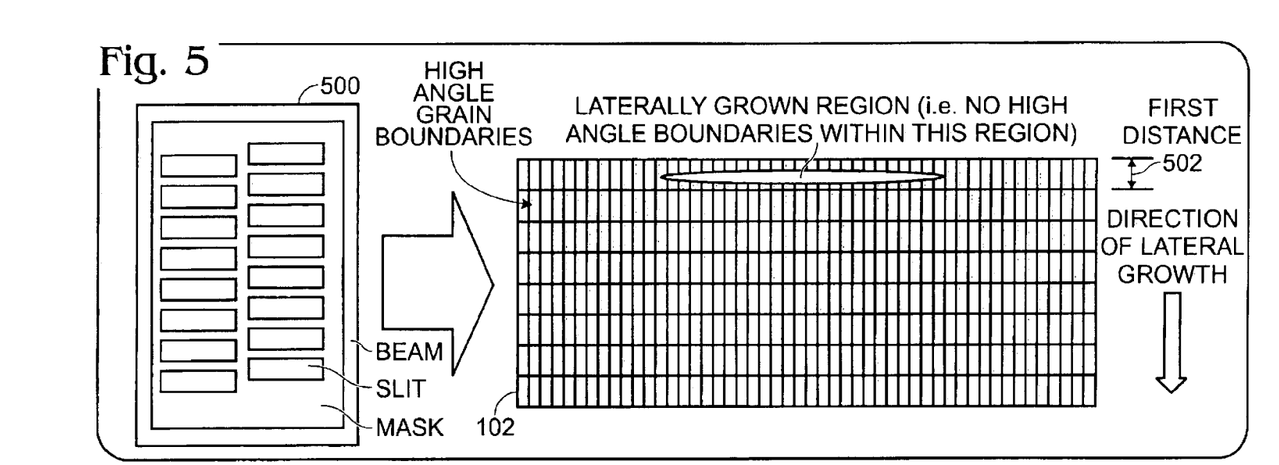
FIG. 5 is a representation of the first area of the substrate of FIG. 4 and of a mask such as might be used to form the first area.

FIG. 5 is a representation of the first area 102 of the substrate of FIG. 4 and of a mask 500 such as might be used to form the first area 102. The first area includes adjacent high-angle grain boundaries separated by a first distance 502. Between the high-angle boundaries are low angle boundary regions, having a crystal lattice mismatch angle of less than 15 degrees are explained above in the description of FIG. 1.

Figure 6:
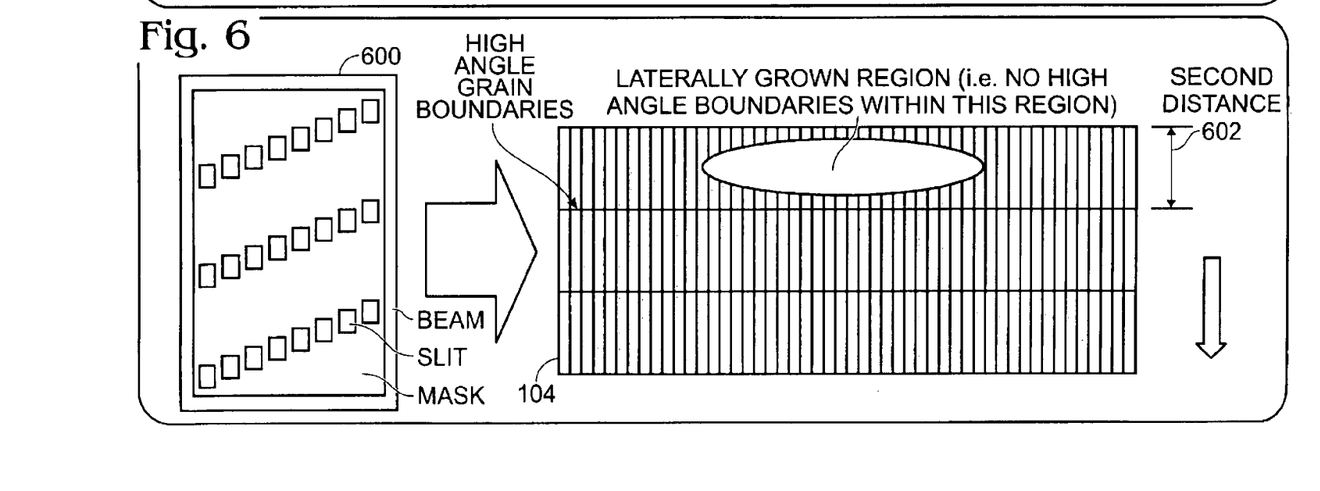
FIG. 6 is a representation of the second area of the substrate of FIG. 4 and of a mask such as might be used to form the second area.

FIG. 6 is a representation of the second area 104 of the substrate of FIG. 4 and of a mask 600 such as might be used to form the second area 104. The second area 104 includes adjacent high-angle grain boundaries separated by second distance 602, greater than the first distance (See FIG. 5).

Figure 7:
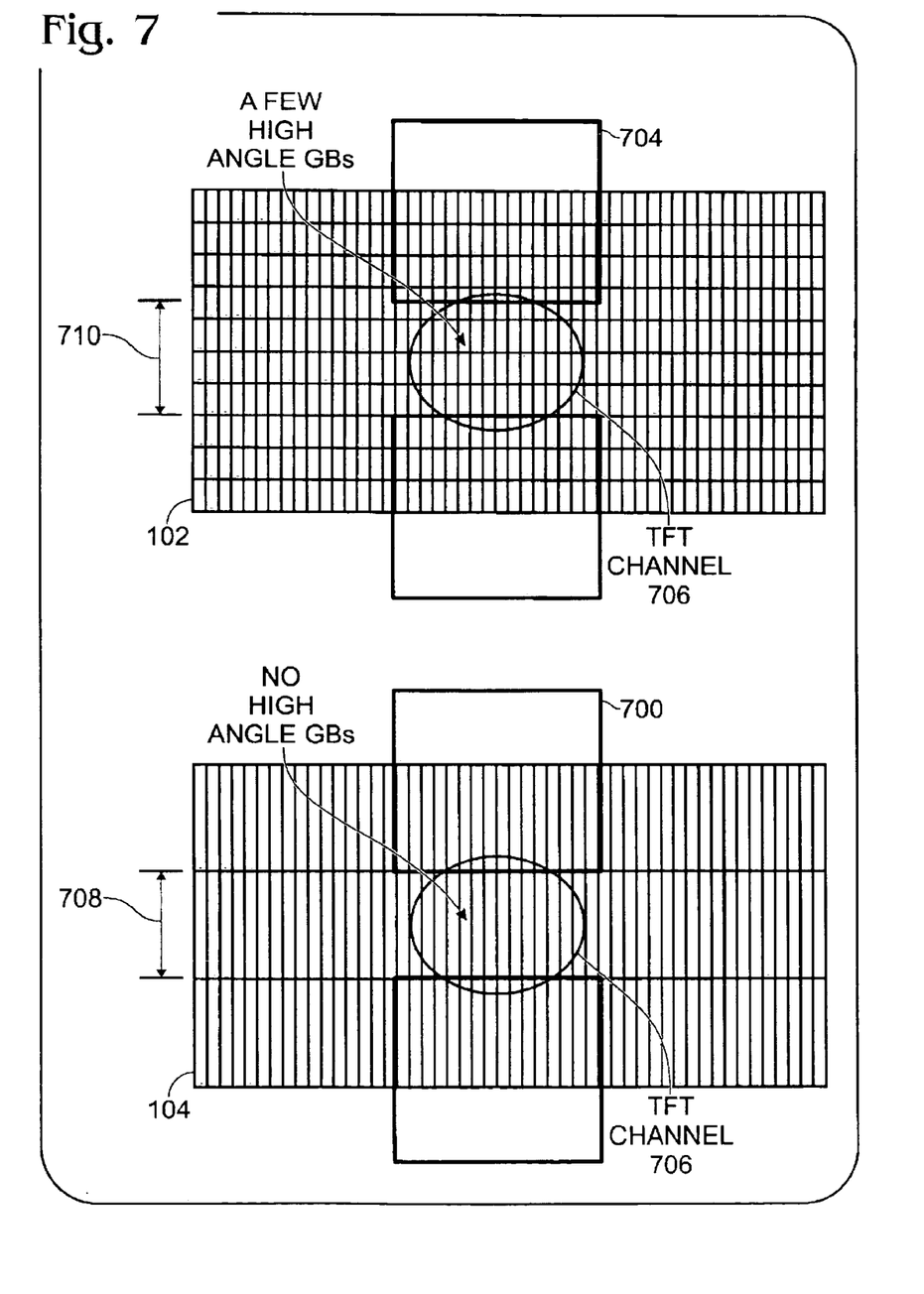
FIG. 7 is a comparison of a transistor formed in the first and second areas of the substrate of FIG. 4.

FIG. 7 is a comparison of a transistor formed in the first and second areas 102/104 of the substrate of FIG. 4. As shown, at least one transistor 700 including a channel region 702 is formed in the second area 104, and at least one transistor 704 including a channel region 706 is formed in the first area 102. The second area transistor channel region 702 has a length 708 less than, or equal to the second distance, completely formed between adjacent high-angle grain boundaries (GBs). The first area transistor channel region 706 has a length 710 greater than the first distance, including at least one high-angle grain boundary. As shown, the channel region spans three high-angle grain boundaries.

It should be understood that the transistors of FIG. 7 are offered only as one illustration of the invention. In some aspects of the substrate, the channel regions may span high-angle grain boundaries in both the first and second regions, but with the number of the number of high-angle grain boundaries spanned by the second area channel 702 being fewer than those spanned by the first area channel 706. In other aspects, both areas may permit channel regions to be formed between adjacent high-angle boundaries, but with the second area permitting a larger number of higher quality channel regions per area. Further, it should be understood that the distance between high-angle adjacent boundaries is just one measure of quality. Other equally valid means of qualitatively expressing the crystalline quality in a substrate region exist, but are not mentioned herein in the interest of brevity.

FUNCTIONAL DESCRIPTION

The present invention process of forming variable poly-Si material (crystalline) quality relies on the utilization of different beam-shaping mask designs and/or different scanning schemes for the substrate, which moves with respect to the mask. Two examples of different mask designs and the corresponding microstructures are shown in FIGS. 5 and 6. The main difference between these two designs is the length of the laterally grown region, the region included between two successive (adjacent) high-angle grain boundaries. If this region is made large enough, the whole channel of a TFT can fit within this region, meaning than no high-angle grain boundaries will be present in the TFT channel. However, in order to form a sufficiently wide area of such high quality material, the speed of the substrate with respect to the substrate needs to decrease, resulting in a reduction in process throughput. On the other hand, if lower quality transistors can be used with high-angle boundaries permitted to exist in the channel region of the TFT, a much faster process can be implemented, resulting in significantly higher throughput. It should be also stated that even in the case of a lower quality material, the ability of LILaC process to precisely place high-angle boundaries to specific locations, yields highly uniform material and highly uniform device performance.

In FIG. 5, the mask design (two steps in the "staircase" design) results in material that has relatively narrow lateral growth regions, separated by high-angle boundaries. The location of these boundaries are defined by the center-lines of adjacent offset slits on the mask. In the second mask design of FIG. 6, the lateral grown is significantly extended by using the multi-step "staircase-slit" design. In this case, the lateral growth regions are bounded between high-angle boundaries developing at approximately the location in the middle of the right-most leading "step" of each staircase slit.

If n denotes the number of steps in the multi-step staircase design, then the reduction in substrate stage speed between the two-step offset design and the multistep staircase design is a factor of 2/n. The reduction in throughput is also analogous to this ratio.

The improvement in TFT performance can be understood by superimposing the TFT channel to the poly-Si microstructure, as shown in FIG. 7. As shown in the left illustration, a few high-angle boundaries are included in the channel of TFT fabricated with p-Si material generated by the two offset-slit mask design. In contrast, no high-angle grain boundaries (GBs) are included in the channel of TFTs made with the multi-step staircase mask design. Other variations, resulting in material quality between these two cases, can be easily implemented by appropriate mask designs. Other mask designs could also be implemented to yield even better performance material than in these examples. For example, a single-crystal Si material without high-angle or low-angle grain boundaries.

The method to form material of a pre-selected quality to regions of prescribed coordinates on the panel is described next. The method utilizes a number of different masks, each having a pattern scheme that yields a certain poly-Si material quality. A highly accurate registration system is used to move the substrate at the appropriate location and then, crystallization of the desired area is performed using the appropriate mask. The substrate moves to another location and, if a new mask is needed, a new mask is simultaneously selected from a preloaded battery of masks and brought into position. During the process, the substrate not only moves in x and y axes, but it can also rotate depending upon the user requirement. The process repeats until all of the appropriate areas are crystallized. Then, the substrate is unloaded and a new substrate is loaded. The process is summarized as follows:

Load a bank of masks;
Load/Aligh/Home Substrate;
Move substrate to a first location/Load first mask;
Anneal a specified first region;
Move substrate to a second location/if needed unload first mask and load a second mask;
Anneal a specified second region;
Repeat move substrate/unload-load mask steps as many times as required to complete the crystallization of the complete substrate; and,
Unload Substrate/Load New Substrate.

An example of the end result of this process is shown in FIG. 4. In this example, all regions marked as "1" are annealed first with mask 1, followed by regions marked as "2" by mask 2, followed by regions marked as "3" by mask 3, and finally by regions marked as "4" by mask 4. Region 1 can be the LCD display pixel array, which requires the lowest quality poly-Si material. Region 2 can be the LCD column drivers of the display, which require higher quality material. Region 3 can be the LCD row drivers of the display, which can be made of the same quality material as the column drivers or could be made of higher quality material. Region 4 can represent an area on the LCD display where higher function are integrated, such as on-board memory or other special features, which require the highest quality material of all regions.

Using the quality segmentation approach of the present invention, the time to prepare a substrate having such a complicated structure is shorter than the time that would required if all of the area were to be crystallized using the more stringent quality requirements of region 4.

Figure 8:
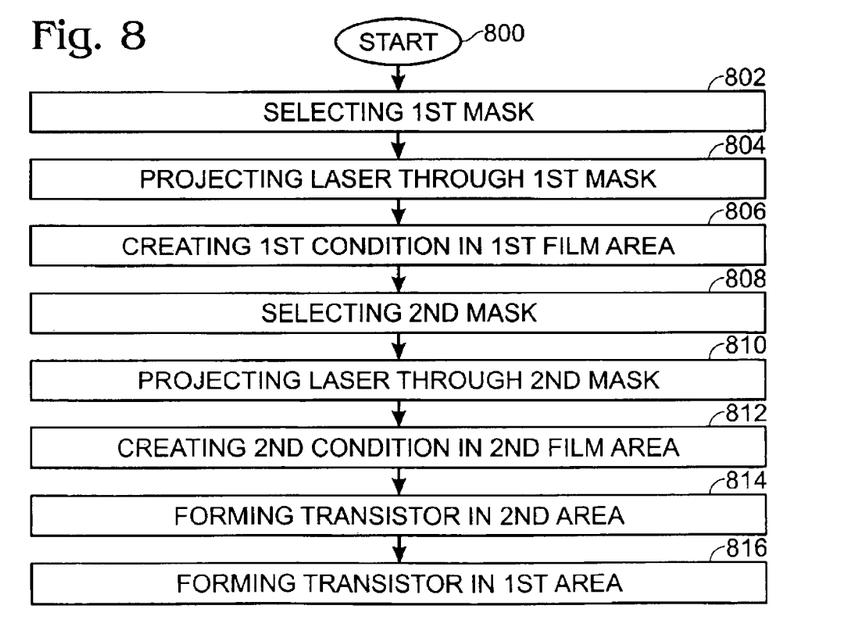
FIG. 8 is a flowchart illustrating the present invention method for fabricating variable quality substrate materials.

FIG. 8 is a flowchart illustrating the present invention method for fabricating variable quality substrate materials. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 800. Step 802 selects a first mask having a first mask pattern. Step 804 projects a laser beam through the first mask to anneal a first area of semiconductor substrate. Step 806 creates a first condition in the first area of the semiconductor film. Step 808 selects a second mask having a second mask pattern. Step 810 projects the laser beam through the second mask to anneal a second area of the semiconductor film. Step 812 creates a second condition in the second area of the semiconductor film, different than the first condition.

In some aspects of the method, creating a first condition in the first area of the semiconductor film in Step 806 includes creating crystalline material with a first lattice mismatch between adjacent crystal domains, and creating a second condition in the second area of the semiconductor film in Step 812 includes creating crystalline material with a second lattice mismatch between adjacent crystal domains, less than the first lattice mismatch.

In other aspects, creating crystalline material with a first lattice mismatch between crystal boundary areas in Step 806 includes forming a first number of high-angle grain boundaries per area. Forming a first number of high-angle grain boundaries per area includes forming a first number of high-angle grain boundaries per area with a crystal lattice mismatch angle in the range between 15 and 90 degrees. Creating crystalline material with a second lattice mismatch between crystal boundary areas, less than the first lattice mismatch, in Step 812 includes forming a second number of high-angle grain boundaries per area, smaller than the first number per area. Forming a second number of high-angle grain boundaries per area also includes forming a second number of high-angle grain boundaries per area with a crystal lattice mismatch angle in the range between 15 and 90 degrees, less than the first number per area.

In some aspects of the method, forming a first number of high-angle grain boundaries per area in Step 806 includes forming adjacent high-angle grain boundaries separated by a first distance. Forming a second number of high-angle grain boundaries per area in Step 812 includes forming adjacent high-angle grain boundaries separated by a second distance, greater than the first distance.

The method comprises further steps in some aspects. Step 814 forms at least one transistor including a channel region in the second area. Step 816 forms at least one transistor including a channel region in the first area. In some aspects, forming the transistor in the second area includes completely forming a transistor channel region, having a length less than, or equal to the second distance, between adjacent high-angle grain boundaries. Forming the transistor in the first area includes forming a transistor channel region, having a length greater than the first distance, including at least one high-angle grain boundary.

In other aspects of the method, Steps 802 and 808 include selecting a plurality of masks. Steps 804 and 810 include projecting the laser beam through each mask to anneal a corresponding area of semiconductor substrate, and Steps 806 and 812 include creating a particular condition in each area of the semiconductor film.

In other aspects of the method, projecting the laser beam through the first mask to anneal a first area of semiconductor substrate in Step 804 includes using the first mask to laser anneal a plurality of nonadjacent regions of semiconductor film. In one aspect, using the first mask to laser anneal a plurality of nonadjacent regions of semiconductor film includes sequentially exposing each first area region to the projected laser beam and sequentially annealing each of the nonadjacent regions of the first area. Likewise Step 810, of projecting the laser beam through the second mask to anneal a second area of semiconductor substrate, includes using the second mask to laser anneal a plurality of nonadjacent regions of semiconductor film in an analogous manner. This process permits the substrate to move, to expose nonadjacent areas without changing the masks.

Alternately, Step 801a (not shown) establishes an order of adjacent regions across the semiconductor film. Step 801b (not shown) aligns the laser beam with the semiconductor film in the established order. Then, using the first mask to laser anneal a plurality of nonadjacent regions of semiconductor film in Step 804 includes projecting the laser beam through the first mask when the laser beam is aligned with a first area region. Using the second mask to laser anneal a plurality of nonadjacent regions of semiconductor film in Step 810 includes projecting the laser beam through the second mask when the laser beam is aligned with a second area region. This process permits the substrate to be moved consistently along a straight line. Different quality areas are formed in the substrate line by swapping masks.

A substrate and substrate fabrication process for forming variable quality areas on a substrate have been provided. Besides the examples given above, the present invention could be used for different LCD display types build upon the same substrate, having different material quality levels on each. Another variation could build different size LCD displays on a given panel, with or without variation in the quality levels for each display size. Other variations and embodiments of the present invention will occur to those skilled in the art.

We claim:

1. A variable quality semiconductor film substrate comprising:
   a first area with semiconductor film including crystalline material having a first lattice mismatch between adjacent crystal domains; and,
   a second area with semiconductor film including crystalline material having a second lattice mismatch between adjacent crystal domains, less than the first lattice mismatch.

2. The substrate of claim 1 further comprising:
   a plurality of areas with semiconductor film including crystalline material, each area having a particular degree of lattice mismatch between adjacent crystal domains.

3. The substrate of claim 1 wherein the first area includes a first number of high-angle grain boundaries per area; and,
   wherein the second area includes a second number of high-angle grain boundaries per area, smaller than the first number per area.

4. The substrate of claim 3 wherein the first area includes a first number of high-angle grain boundaries per areas with a crystal lattice mismatch angle in the range between 15 and 90 degrees; and,
   wherein the second area includes a second number of high-angle grain boundaries per areas with a crystal lattice mismatch angle in the range between 15 and 90 degrees, less than the first number per area.

5. The substrate of claim 3 wherein the first area includes adjacent high-angle grain boundaries separated by a first distance; and,
   wherein the second area includes adjacent high-angle grain boundaries separated by second distance, greater than the first distance.

6. The substrate of claim 5 further comprising:
at least one transistor including a channel region formed in the second area; and,
at least one transistor including a channel region formed in the first area.

7. The substrate of claim 6 wherein the second area transistor channel region has a length less than, or equal to the second distance, completely formed between adjacent high-angle grain boundaries.

8. The substrate of claim 7 wherein the first area transistor channel region has a length greater than the first distance, including at least one high-angle grain boundary.

9. The substrate of claim 1 wherein the semiconductor film is silicon.

10. A polycrystalline silicon substrate including variable quality transistors, the substrate comprising:
a first area with at least one transistor having a channel region with a length greater than the distance between high-angle grain boundaries, including at least one high-angle grain boundary; and,
a second area with at least one transistor having a channel region with a length less than, or equal to the distance between high-angle grain boundaries, completely formed between adjacent high-angle grain boundaries.

11. A liquid crystal display (LCD) panel fabricated with a variable quality semiconductor film substrate, the panel comprising:
a first area including crystalline material having a first lattice mismatch between adjacent crystal domains; and,
a second area including crystalline material having a second lattice mismatch between adjacent crystal domains, less than the first lattice mismatch.

12. A liquid crystal display (LCD) panel fabricated with a variable quality semiconductor film substrate, the panel comprising:
a pixel array substrate area including crystalline material having a first lattice mismatch between adjacent crystal domains;
a column drivers substrate area including crystalline material having a second lattice mismatch between adjacent crystal domains, less than the first lattice mismatch;
a row drivers substrate area including crystalline material having the third lattice mismatch between adjacent crystal domains, less than the first lattice mismatch; and,
an on-board memory substrate area including crystalline material having a fourth lattice mismatch between adjacent crystal domains, less than the second and third lattice mismatches.

* * * * *